(12) United States Patent
Yu et al.

(10) Patent No.: US 8,633,520 B2
(45) Date of Patent: Jan. 21, 2014

(54) SEMICONDUCTOR DEVICE

(75) Inventors: Dong-Hee Yu, Hwaseong-si (KR);
Bong-Seok Suh, Hwaseong-si (KR);
Yoon-Hae Kim, Yongin-si (KR); O Sung Kwon, Wappingers Falls, NY (US); Oh-Jung Kwon, Hopewell Junction, NY (US)

(73) Assignees: Samsung Electronics Co., Ltd. (KR);
Infineon Technologies AG, Neubiberg (DE); International Business Machines Corporation, Armonk, NY (US)

( * ) Notice: Subject to any disclaimer, the term of this patent is extended or adjusted under 35 U.S.C. 154(b) by 343 days.

(21) Appl. No.: 12/909,002

(22) Filed: Oct. 21, 2010

(65) Prior Publication Data

US 2012/0098073 A1    Apr. 26, 2012

(51) Int. Cl.
*H01L 23/52* (2006.01)

(52) U.S. Cl.
USPC .... 257/211; 257/374; 257/510; 257/E23.142; 257/E23.145; 257/E23.001; 257/E23.151

(58) Field of Classification Search
USPC .......... 257/211, 374, 510, E23.142, E23.145, 257/E23.001, E23.151; 438/618, 622, 633, 438/637
See application file for complete search history.

(56) References Cited

U.S. PATENT DOCUMENTS

| | | | |
|---|---|---|---|
| 6,153,510 A * | 11/2000 | Ishibashi | 438/622 |
| 6,326,306 B1 | 12/2001 | Lin | |
| 6,541,863 B1 | 4/2003 | Horstmann et al. | |
| 6,727,590 B2 * | 4/2004 | Izumitani et al. | 257/758 |
| 2007/0267674 A1 * | 11/2007 | Lin et al. | 257/306 |
| 2009/0159978 A1 * | 6/2009 | Matsubara et al. | 257/368 |

FOREIGN PATENT DOCUMENTS

KR    1020060018633 A    3/2006

* cited by examiner

*Primary Examiner* — Michelle Mandala
(74) *Attorney, Agent, or Firm* — Myers Bigel Sibely & Sajovec, P.A.

(57) ABSTRACT

A semiconductor device is provided. The semiconductor device includes: a substrate; device isolation regions formed in the substrate; an impurity region formed in a region of the substrate between every two adjacent ones of the device isolation regions; a gate electrode formed on the substrate; first and second interlayer insulating films sequentially formed on the substrate; a metal interlayer insulating film formed on the second interlayer insulating film and comprising metal wiring layers; a first contact plug electrically connecting each of the metal wiring layers and the impurity region; and a second contact plug electrically connecting each of the metal wiring layers and the gate electrode, wherein the first contact plug is formed in the first and second interlayer insulating films, and the second contact plug is formed in the second interlayer insulating film.

20 Claims, 10 Drawing Sheets

SEMICONDUCTOR DEVICE

FIELD OF THE INVENTION

The present invention relates to a semiconductor device.

BACKGROUND

The ongoing technological development in the field of semiconductor fabrication is resulting in integrated circuits with higher device density, lower power consumption, and higher operation speed. Generally, a highly integrated circuit is designed using a multi-layer wiring structure that includes an embedded metal wiring layer and a contact plug.

In addition, an embedded metal wiring layer and a contact plug are formed by forming a contact hole in an insulating film and filling the contact hole with a conductive material.

As the thickness of an insulating film in which a contact hole is formed increases, it becomes difficult to secure the contact area and to completely fill the contact hole to a bottom surface thereof with a conductive material, thereby causing open defects.

SUMMARY

Aspects of the present invention provide a semiconductor device with reduced contact resistance between a contact plug and a structure thereunder, the contact plug having enhanced resistance characteristics.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a semiconductor device including: a substrate; device isolation regions formed in the substrate; an impurity region formed in a region of the substrate between two adjacent ones of the device isolation regions; a gate electrode formed on the substrate; first and second interlayer insulating films sequentially formed on the substrate; a metal interlayer insulating film formed on the second interlayer insulating film and comprising metal wiring layers; a first contact plug electrically connecting each of the metal wiring layers and the impurity region; and a second contact plug electrically connecting each of the metal wiring layers and the gate electrode, wherein the first contact plug is formed in the first and second interlayer insulating films, and the second contact plug is formed in the second interlayer insulating film.

According to another aspect of the present invention, there is provided a semiconductor device including: a substrate; device isolation regions formed in the substrate; an impurity region formed in a region of the substrate between two adjacent ones of the device isolation regions; a gate electrode formed on the substrate; metal wiring layers formed on the substrate; a first contact plug electrically connecting each of the metal wiring layers and the impurity region and including first and second sub contact plugs which are sequentially formed on the impurity region; and a second contact plug electrically connecting each of the metal wiring layers and the gate electrode, wherein the first contact plug and the second contact plug are made of different conductive materials, and the second contact plug and the second sub contact plug are made of the same conductive material.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification. In some embodiments, well-known processes, well-known structures, and well-known technologies will not be specifically described in order to avoid ambiguous interpretation of the present invention. Like reference numerals refer to like elements throughout the specification.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof. As used herein, the term "and/or" includes any and all combinations of one or more of the associated listed items. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described with reference to the attached drawings.

Figure 1:
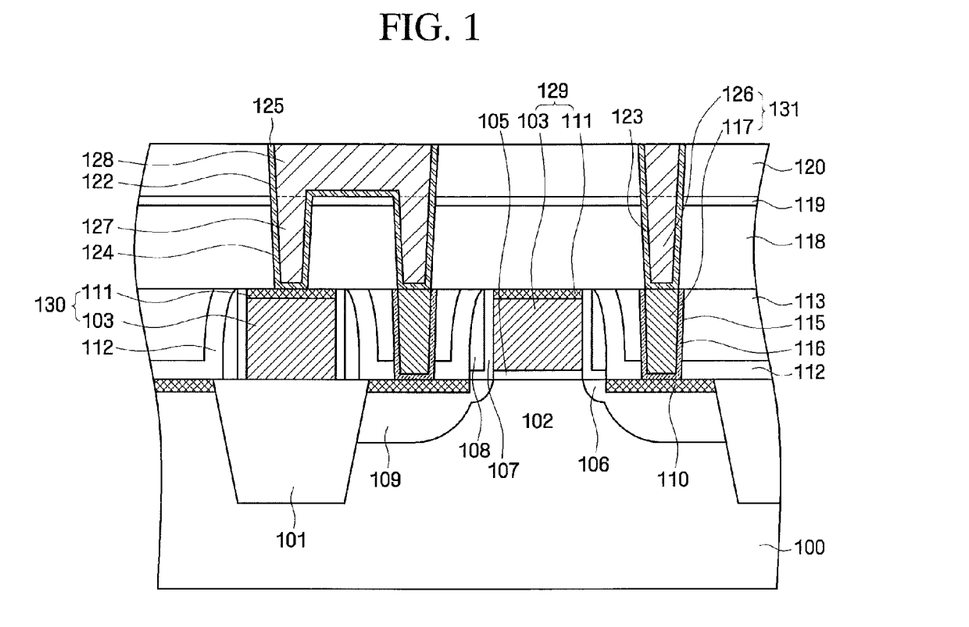
FIG. 1 is a cross-sectional view of a semiconductor device according to an exemplary embodiment of the present inventive concept.

FIG. 1 is a cross-sectional view of a semiconductor device according to an exemplary embodiment of the present inventive concept.

Referring to FIG. 1, a plurality of device isolation regions 101 are formed in a substrate 100. A region between every two adjacent ones of the device isolation regions 101 is defined as an active region 102. The substrate 100 may be, but is not limited to, a silicon-on-insulator (SOI) substrate or a substrate which is made of one or more semiconductor materials selected from Si, Ge, SiGe, GaP, GaAs, SiC, SiGeC, InAs, and InP.

A plurality of gate electrodes are disposed on the substrate 100. Specifically, a first gate electrode 129 may be disposed on the active region 102 of the substrate 100 with a gate insulating film 105 interposed therebetween. On the other hand, a second gate electrode 130 may be disposed directly on each of the device isolation regions 101 without the gate insulting film 105 interposed therebetween.

Each of the first and second gate electrodes 129 and 130 may be a single film such as a polysilicon film, a metal film, or a silicide film. Alternatively, each of the first and second gate electrodes 129 and 130 may be a laminated film composed of the polysilicon film, the metal film, and the silicide film. Examples of a metal component of the metal film or the silicide film may include W, Ta, Ti, Mo, Hf, Zr, Co, Ni, Pt, and Ru. In the embodiment of FIG. 1, each of the first and second gate electrodes 129 and 130 includes a polysilicon film 103 and a silicide film 111 formed on the polysilicon film 103.

The gate insulating film 105 may be made of SiOx, SiON, or a high-k dielectric material. The high-k dielectric material may be $HfO_2$, $ZrO_2$, $Al_2O_3$, $Ta_2O_5$, HfSiON, hafnium silicate, zirconium silicate, or a combination of the same.

A first spacer 107 and a second spacer 108 are disposed on sidewalls of each of the first and second gate electrodes 129 and 130. Each of the first and second spacers 107 and 108 may be made of SiOx, SiON, or a combination of the same. When necessary, any one of the first and second spacers 107 and 108 may be omitted.

Impurity regions doped with impurities are formed in a region of the substrate 100 between two adjacent ones of the device isolation regions 101. The impurity regions are formed on both sides of the first gate electrode 129 to face each other with respect to the first gate electrode 129. The impurity regions include lightly doped impurity regions 106 which are overlapped by the first and second spacers 107 and 108 and heavily doped regions 109 which are not overlapped by the first and second spacers 107 and 108. A silicide film 110, which is identical or similar to the silicide film 111 formed on the polysilicon film 103 of each of the first and second gate electrodes 129 and 130, may be formed on each of the highly doped impurity regions 109.

A liner insulating film 112 and a first interlayer insulating film 113 are disposed on the substrate 100 having the first and second gate electrodes 129 and 130. The liner insulating film 112 may be made of, e.g., SiNx. The first interlayer insulating film 113 may be made of SiOx, SiOF, boron phospho silicate glass (BPSG), tetraethyl orthosilicate (TEOS), undoped silicate glass (USG), or a high aspect ratio process (HARP) oxide film.

Top surfaces of the first interlayer insulating film 113 and the liner insulating film 112 may be at the same height from the substrate 100 as top surfaces of the first and second gat electrodes 129 and 130. The top surfaces of the first insulating film 113 and the liner insulating film 112 are planarized to be at the same height as the top surfaces of the first and second gate electrodes 129 and 130. The height of the top surface of the first interlayer insulating film 113 from the substrate 100 may be equal to a thickness of the second gate electrode 130 formed on each of the device isolation regions 101 and may be approximately 700 Å or less.

A first contact hole 115 is formed in the liner insulating film 112 and the first interlayer insulating film 113. The first contact hole 115 exposes a predetermined region of the silicide film 110 formed on each of the heavily doped impurity regions 109. A first contact plug 131 connects each of the heavily doped impurity regions 109 and a metal wiring layer 128, and a first sub contact plug 117 of the first contact plug 131 is formed in the first contact hole 115.

The first sub contact plug 117 includes a first barrier metal film 116 which is conformally formed along inner walls of the first contact hole 115 and a conductive material which fills the first contact hole 115. The first barrier metal film 116 may be a single film made of Ti, TiN, Ta or TaN, or may be a double film made of two of the above materials. The conductive material that fills the first contact hole 115 may be, e.g., tungsten.

Since the first contact hole 115 is formed in the liner insulating film 112 and the first interlayer insulating film 113 which are planarized to the height of the first and second gate electrodes 129 and 130, a sufficient contact area can be secured between the first sub contact plug 117 and the silicide film 110, and open defects which may occur in the process of filling the first contact hole 115 with the conductive material can be prevented.

A second interlayer insulating film 118, an etch-stop film 119, and a metal interlayer insulating film 120 are sequentially disposed on the first interlayer insulating film 113 having the first sub contact plug 117. The second interlayer insulating film 118 may be made of a low-k dielectric material. For example, the second interlayer insulating film 118 may be made of silicon oxycarbide (SiOC), carbon-doped hydrogenated silicon oxide (SiOCH), fluoro-silses-quioxane (FSQ), hydro-silses-quioxane (HSQ), or methyl-silses-quioxane (MSQ). The second interlayer insulating film 118 made of a low-k dielectric material can reduce the capacitance between the metal wiring layer 128 and each of the first and second gate electrodes 129 and 130 or between the metal wiring layer 128 and each of the heavily doped impurity regions 109. The etch-stop film 119 may be made of a material having a high etch selectivity with respect to the metal interlayer insulating film 120. For example, the etch-stop film 119 may be made of SiC, SiN, SiCN, SiCO, or SiCON. If the second interlayer insulating film 118 and the metal interlayer insulating film 120 are made of materials having high etch selectivities with respect to each other, the etch-stop film 119 may not be formed. The metal interlayer insulating film 120 may be made of SiOx, SiOF, BPSG, TEOS, or the like.

A second contact hole 123 and a third contact hole 124 are formed in the second interlayer insulating film 118 and the etch-stop film 119. The second contact hole 123 exposes a predetermined region of the first sub contact plug 117, and the third contact hole 124 exposes a predetermined region of the top surface of the second gate electrode 130. Trenches 122 are formed in the metal interlayer insulating film 120 to form the metal wiring layer 128. A second sub contact plug 126 of the first contact plug 131 which connects each of the heavily doped impurity regions 109 and the metal wiring layer 128 is formed in the second contact hole 123. A second contact plug 127 which connects the second gate electrode 130 and the metal wiring layer 128 is formed in the third contact hole 124. The metal wiring layer 128 is formed in each of the trenches 122. In FIG. 1, the metal wiring layer 128, the second sub contact plug 126, and the second contact plug 127 are made of the same material. However, the present inventive concept is not limited thereto.

The second sub contact plug 126, the second contact plug 127, and the metal wiring layer 128 include a second barrier metal film 125 which is conformally formed along inner walls of the second contact hole 123, the third contact hole 124, and the trenches 122 and a conductive material which fills the second contact hole 123, the third contact hole 124, and the trenches 122. The second barrier metal film 125 may be a single film made of Ti, TiN, Ta or TaN, or may be a double film made of two of the above materials. The conductive material that fills the second contact hole 123, the third contact hole 124, and the trenches 122 may have a lower resistance than the conductive material that fills the first contact hole 115. For example, the conductive material that fills the second contact hole 123, the third contact hole 124, and the trenches 122 may be made of copper. Unlike the first sub contact plug 117, if the second contact plug 127 which is connected to the second gate electrode 130 is made of copper having a low resistance, the resistance of the second contact plug 127 can be reduced. In addition, if the second sub contact plug 126 which is part of the first contact plug 131 is made of copper having a low resistance, the resistance of the first contact plug 131 can be reduced.

Figure 2:
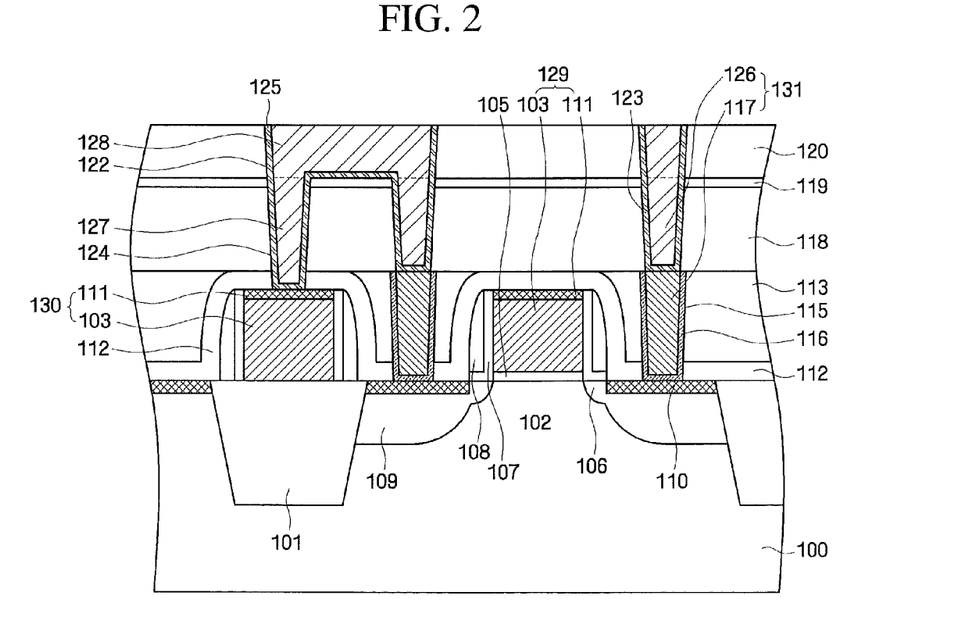
FIG. 2 is a cross-sectional view of a semiconductor device according to another exemplary embodiment of the present inventive concept.

FIG. 2 is a cross-sectional view of a semiconductor device according to another exemplary embodiment of the present inventive concept. A description of structures substantially identical to those of the previous embodiment described above with reference to FIG. 1 will be omitted or simplified, and differences between them will mainly be described.

Referring to FIG. 2, in the semiconductor device according to the current exemplary embodiment, a liner insulating film 112 is not removed from top surfaces of first and second gate electrodes 129 and 130. In addition, a top surface of the liner insulating film 112 disposed on the first and second gate electrodes 129 and 130 may be at the same height from a substrate 100 as a top surface of a first interlayer insulating film 113.

A second contact plug 127 which connects the second gate electrode 130 and a metal wiring layer 128 is formed in the liner insulating film 112 and a second interlayer insulating film 118.

Hereinafter, a method of fabricating a semiconductor device according to an exemplary embodiment of the present inventive concept will be described in detail with reference to FIGS. 1, and 3 through 9. FIGS. 3 through 9 are cross-sectional views respectively and sequentially showing processes included in a method of fabricating the semiconductor device of FIG. 1.

Figure 3:
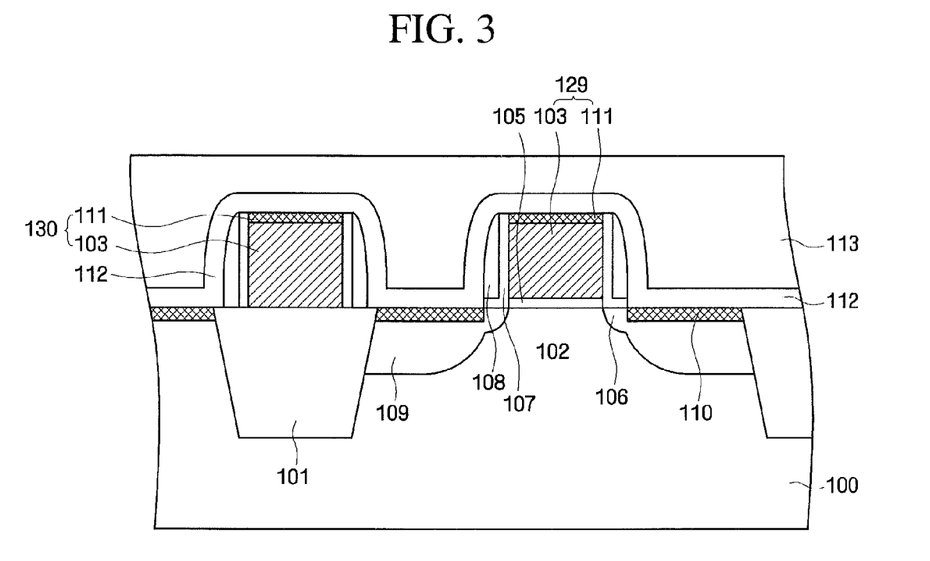
FIGS. 3 through 9 are cross-sectional views respectively and sequentially showing processes included in a method of fabricating the semiconductor device of FIG. 1.

Referring to FIG. 3, the device isolation regions 101 are formed in the substrate 100. The device isolation regions 101 may be formed by local oxidation of silicon (LOCOS) or shallow trench isolation (STI). A region between two adjacent ones of the device isolation regions 101 is defined as the active region 102.

A plurality of gate electrodes are formed on the substrate 100. The first gate electrode 129 formed on the active region 102 is disposed on the gate insulating film 105. On the other hand, the second gate electrode 130 may be formed directly on each of the device isolation regions 101 without the gate insulating film 105 interposed therebetween.

The gate insulating film 105 may be formed by depositing and patterning a high-k dielectric material such as SiOx, SiON, $HfO_2$, $ZrO_2$, $Al_2O_3$, $Ta_2O_5$, HfSiON, hafnium silicate, zirconium silicate, or a combination of the same. The gate insulating film 105 may be deposited by chemical vapor deposition (CVD), plasma enhanced chemical vapor deposition (PECVD), or low pressure chemical vapor deposition (LPCVD).

The first and second gate electrodes 129 and 130 may be formed by depositing and patterning a polysilicon film or a metal film. The polysilicon film or the metal film may be deposited by LPCVD, atomic layer deposition (ALD), physical vapor deposition (PVD), or metal organic chemical vapor deposition (MOCVD). Examples of a metal component of the metal film or the silicide film may include W, Ta, Ti, Mo, Hf, Zr, Co, Ni, Pt, and Ru. The following description will be based on the assumption that the polysilicon film 103 is used to form each of the first and second gate electrodes 129 and 130.

Next, the lightly doped impurity regions 106 doped with impurities are formed in a region of the substrate 100 between two adjacent ones of the device isolation regions 101. The lightly doped impurity regions 106 are formed on both sides of the first gate electrode 129 to face each other with respect to the first gate electrode 129. The lightly doped impurity regions 106 may be formed by implanting ions into the active region 102 of the substrate 100 using the polysilicon film 103 of the first gate electrode as an ion implantation mask.

Then, the first spacer 107 and the second spacer 108 are formed on sidewalls of the polysilicon film 103 of each of the first and second gate electrodes 129 and 130. Thereafter, ions are implanted into the active region 102 of the substrate using the first and second spacers 107 and 108 as an ion implantation mask, thereby forming the heavily doped impurity regions 109. When necessary, any one of the first and second spacers 107 and 108 may not be formed.

Next, a silicidation process is performed to form the silicide films 110 and 111 on the heavily doped impurity regions 109 and the polysilicon film 103 of the first and second gate electrodes 129 and 130. Before the silicidation process, a silicide metal film made of Ti, Mo, W, Co, Ni, Ta, Pt or Pd is deposited on the entire surface of the substrate 100 and is then heat-treated. As a result of the heat treatment process, a silicide film is formed in a contact area between the silicide metal film and silicon. In addition, as a result of the silicidation process, the silicide films 110 and 111 are formed respectively on the heavily doped impurity regions 109 and the polysilicon film 103 of each of the first and second gate electrodes 129 and 130. After the heat treatment process, a non-silicidated portion of the silicide metal film is removed.

Next, the liner insulating film 112 is formed on the entire surface of the substrate 100. The liner insulating film 112 may be formed of SiN by CVD, PECVD, or the like.

Next, the first interlayer insulating film 113 is formed on the liner insulating film 112. The first interlayer insulating film 113 may be formed of SiOx, SiOF, BPSG, TEOS, USG, or a HARP oxide film by, e.g., CVD.

Figure 4:
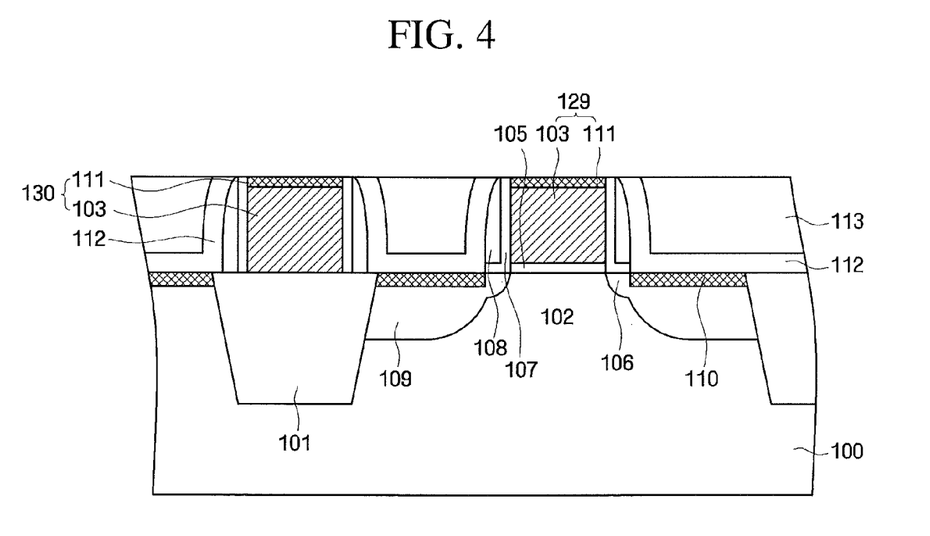

Then, referring to FIG. 4, the first interlayer insulating film 113 is planarized to a top surface of the silicide film 111 of each of the first and second gate electrodes 129 and 130. The planarization process may be a chemical mechanical polishing process or an etch-back process. After the planarization process, the height of the top surface of the first interlayer insulating film 113 from the substrate 100 may be equal to the thickness of the second gate electrode 130 formed on each of the device isolation regions 101 and may be approximately 700 Å or less.

Figure 5:
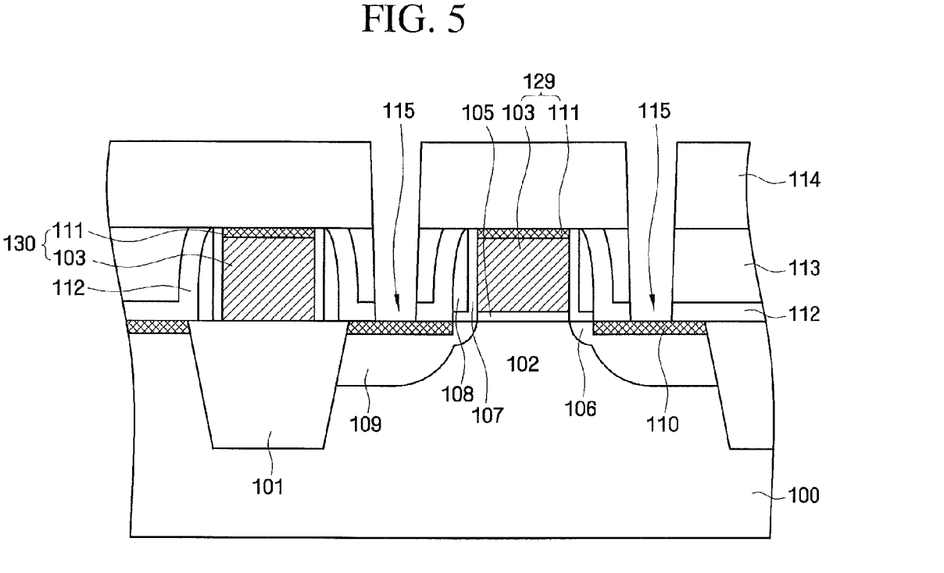

Next, referring to FIG. 5, a first photoresist pattern 114 is formed on the planarized first interlayer insulating film 113 to expose regions corresponding respectively to the heavily doped impurity regions 109. Then, the first interlayer insulating film 113 and the liner insulating film 112 are etched using the first photoresist pattern 114 as an etch mask, thereby forming the first contact hole 115 which exposes a predetermined region of the silicide film 110 on each of the heavily doped impurity regions 109. Here, the first interlayer insulating film 113 and the liner insulating film 112 may be dry-etched or wet-etched.

Figure 6:
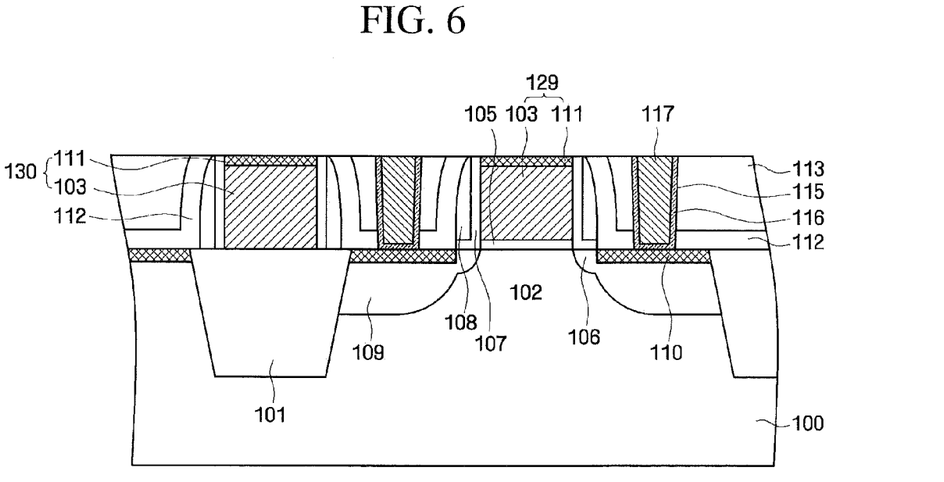

Referring to FIG. 6, the first photoresist pattern 114 is removed, and the first barrier metal film 116 is conformally formed on the inner walls of the first contact hole 115. The first barrier metal film 116 may be a single film made of Ti, TiN, Ta or TaN, or may be a double film made of two of the above materials. The first barrier metal film 116 may be formed by CVD, ALD, sputtering, or electron beam deposition.

Next, the first sub contact plug 117 is formed by filling the first contact hole 115 with a conductive material. The conductive material that fills the first contact hole 115 may be tungsten. The first sub contact plug 117 may formed by filling the first contact hole 115 with tungsten using MOCVD or electrical plating and by processing the surface of the first sub contact plug 117 to be at the same height as the surface of the first interlayer insulating film 113 in a planarization process such as chemical mechanical polishing.

Since the first contact hole 115 is formed in the liner insulating film 112 and the first interlayer insulating film 113 which are planarized to the height of the first and second gate electrodes 129 and 130, a sufficient contact area can be secured between the first sub contact plug 117 and the silicide film 110, and open defects which may occur in the process of filling the first contact hole 115 with the conductive material can be prevented.

Figure 7:
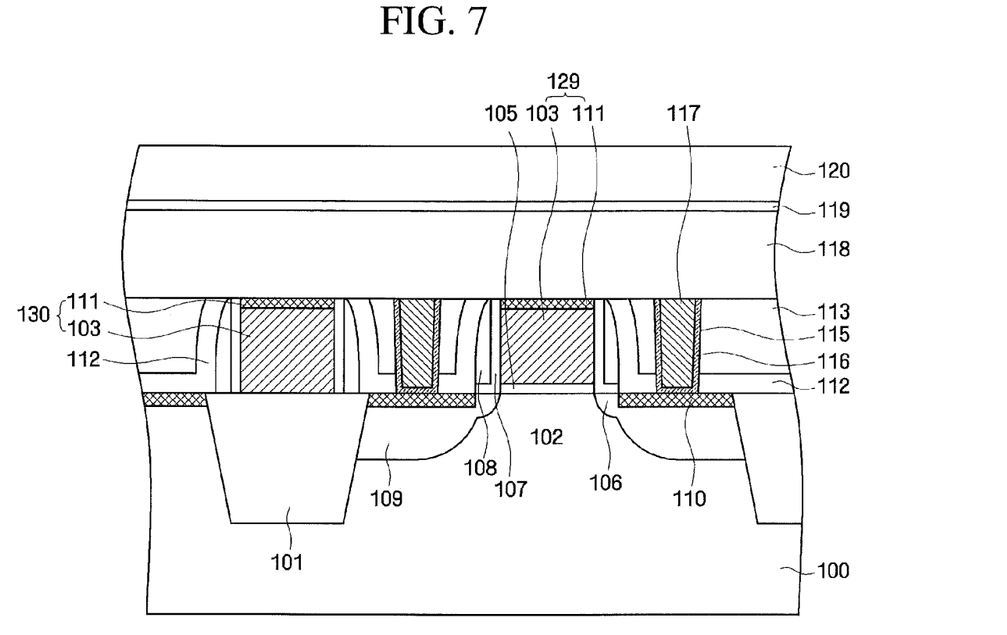

Next, referring to FIG. 7, the second interlayer insulating film 118, the etch-stop film 119, and the metal interlayer insulating film 120 are sequentially formed on the entire surface of the substrate 100 having the first sub contact plug 117. The second interlayer insulating film 118 may be made of a low-k dielectric material. For example, the second interlayer insulating film 118 may be made of SiOC, SiOCH, FSQ, HSQ, or MSQ. The second interlayer insulating film 118 made of a low-k dielectric material can reduce the capacitance between a metal wiring layer, which will be described later, and each of the first and second gate electrodes 129 and 130 or between the metal wiring layer and each of the heavily doped impurity regions 109.

The etch-stop film 119 may serve to stop etching of the metal interlayer insulating film 120 when the metal interlayer insulating film 120 is etched to form trenches. The etch-stop film 119 may be made of a material having a high etch selectivity with respect to the metal interlayer insulating film 120. For example, the etch-stop film 119 may be made of SiC, SiN, SiCN, SiCO, or SiCON. If the second interlayer insulating film 118 and the metal interlayer insulating film 120 are made of materials having high etch selectivities with respect to each other, the etch-stop film 119 may not be formed.

Figure 8:
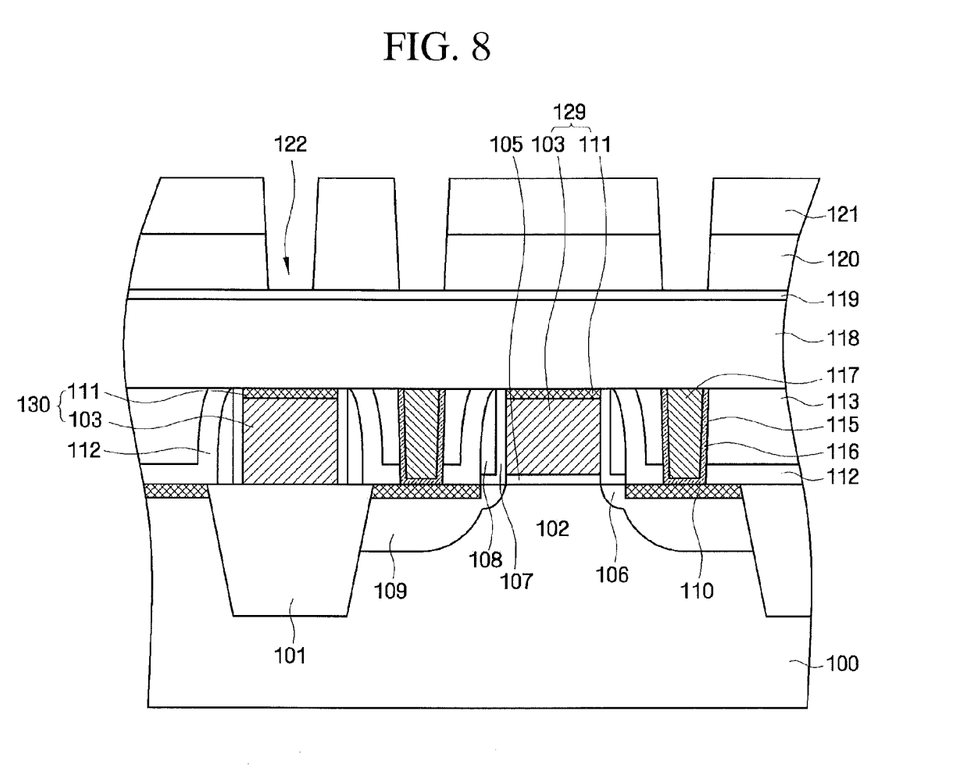

Next, referring to FIG. 8, a second photoresist pattern 121 which exposes regions corresponding to the first sub contact plug 117 and the second gate electrode 130 is formed on the metal interlayer insulating film 120. Then, the metal interlayer insulating film 120 is etched to the etch-stop film 119 using the second photoresist pattern 121 as an etch mask, thereby forming the trenches 122 in the metal interlayer insulating film 120. The metal interlayer insulating film 120 may be etched using reactive ion etching.

Figure 9:
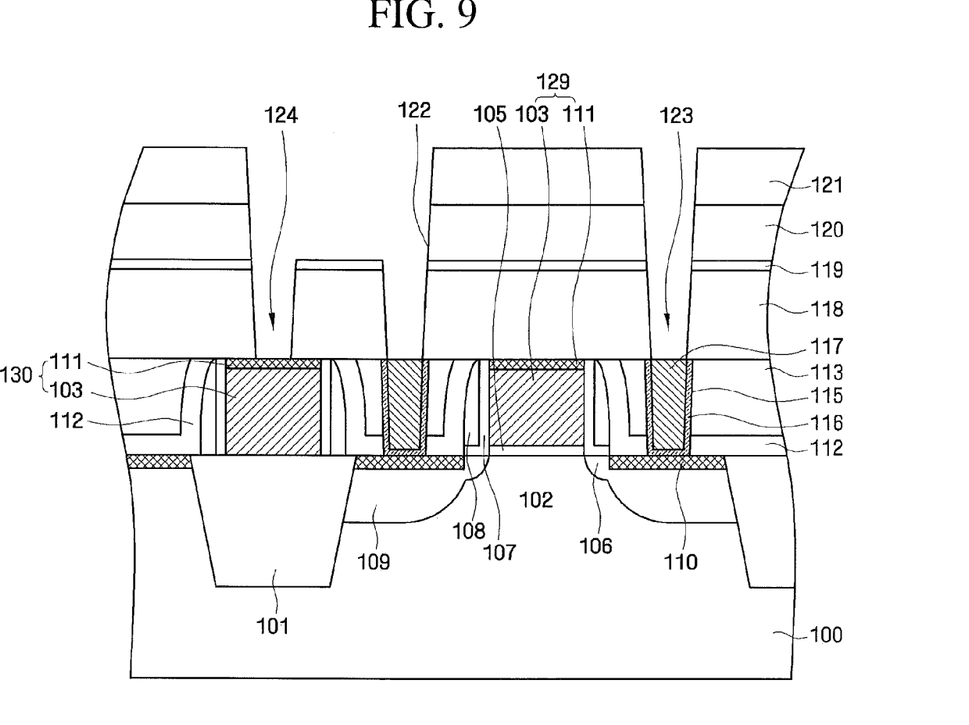

Next, referring to FIG. 9, the etch-stop film 119 and the second interlayer insulating film 118 are etched using the second photoresist pattern 121 as an etch mask, thereby forming the second contact hole 123 which exposes a predetermined region of the first sub contact plug 117 and forming the third contact hole 124 which exposes a predetermined region of the second gate electrode 130. The etch-stop film 119 and the second interlayer insulating film 118 may be etched using reactive ion etching.

Then, a portion of the metal interlayer insulating film 120 formed between regions, which correspond respectively to the second gate electrode 130 and the first sub contact plug 117 neighboring the second gate electrode 130, may be removed.

Next, referring to FIG. 1, the second photoresist pattern 121 is removed, and the second barrier metal film 125 is conformally formed on the inner walls of the trenches 122, the second contact hole 123, and the third contact hole 124. The second barrier metal film 125 may be a single film made of Ti, TiN, Ta or TaN, or may be a double film made of two of the above materials. The second barrier metal film 125 may be formed by CVD, ALD, sputtering, or electron beam deposition.

Then, a conductive material is filled into the trenches 122, the second contact hole 123, and the third contact hole 124, thereby forming the second sub contact plug 126 and the second contact plug 127 in the second interlayer insulating film 118 and forming the metal wiring layer 128 in the metal interlayer insulating film 120. The conductive material that fills the second contact hole 123, the third contact hole 124, and the trenches 122 may have a lower resistance than the conductive material that fills the first contact hole 115. For example, the conductive material that fills the second contact hole 123, the third contact hole 124, and the trenches 122 may be copper. The second sub contact plug 126, the second contact plug 127, and the metal wiring layer 128 may formed by filling the trenches 122 and the second and third contact holes 123 and 124 with copper using MOCVD or electrical plating and by processing the surface of the metal wiring layer 128 to be at the same height as the surface of the metal interlayer insulating film 120 in a planarization process such as chemical mechanical polishing.

Unlike the first sub contact plug 117, if the second contact plug 127 which is connected to the second gate electrode 130 is made of copper having a low resistance, the resistance of the second contact plug 127 can be reduced. In addition, if the second sub contact plug 126 which is part of the first contact plug 131 is made of copper having a low resistance, the resistance of the first contact plug 131 can be reduced.

Hereinafter, a method of fabricating a semiconductor device according to another exemplary embodiment of the present inventive concept will be described in detail with reference to FIGS. 2, 3, and 10 through 15. FIGS. 10 through 15 are cross-sectional views respectively and sequentially showing processes included in a method of fabricating the semiconductor device of FIG. 2. Since most processing conditions of the current embodiment are substantially the same as those of the previous embodiment, a description thereof will be omitted or simplified, and differences between them will mainly be described.

Figure 10:
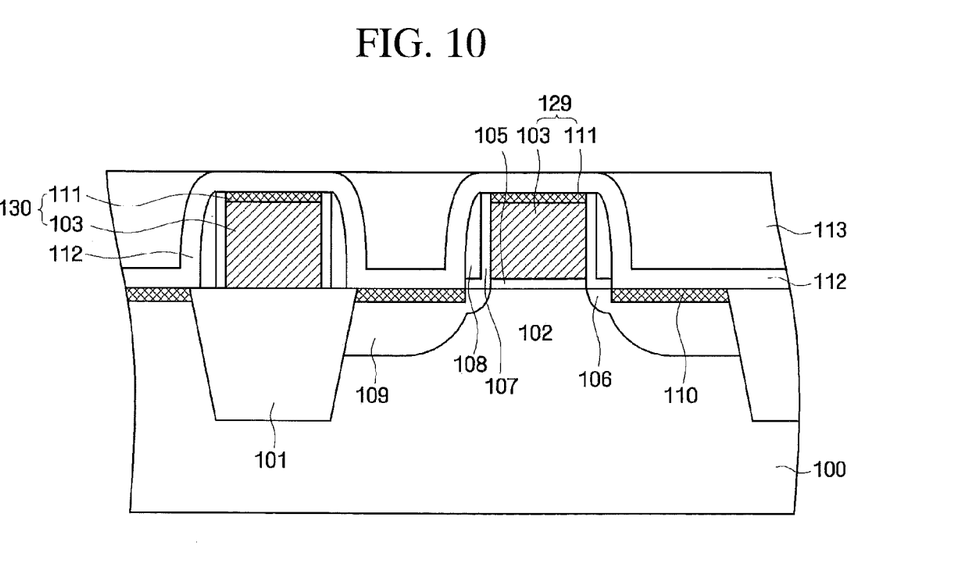
FIGS. 10 through 15 are cross-sectional views respectively and sequentially showing processes included in a method of fabricating the semiconductor device of FIG. 2.

Referring to FIG. 10, in the method of fabricating the semiconductor device of FIG. 2, the interlayer insulating film 113 is formed as shown in FIG. 3 and then planarized to a top surface of the liner insulating film 112 which is disposed on top surfaces of the first and second gate electrodes 129 and 130. After the planarization process, a height of a top surface of the first interlayer insulating film 113 from the substrate 100 may be approximately 1,200 Å or less.

Figure 11:
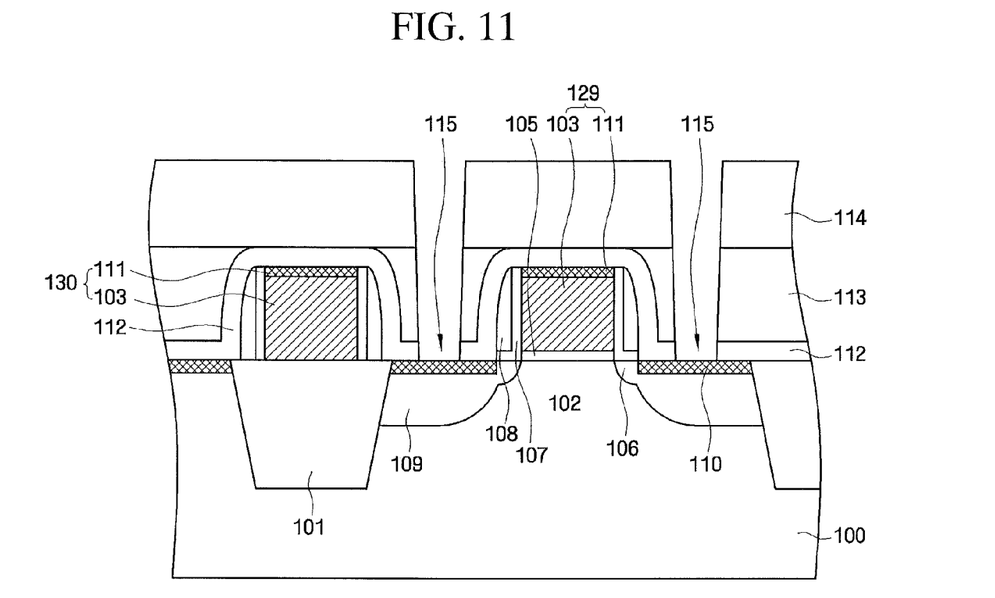

Next, referring to FIG. 11, a first photoresist pattern 114 is formed on the planarized first interlayer insulating film 113 to expose regions corresponding respectively to heavily doped impurity regions 109. Then, the first interlayer insulating film 113 and the liner insulating film 112 are etched using the first photoresist pattern 114 as an etch mask, thereby forming a first contact hole 115 which exposes a predetermined region of a silicide film 110 formed on each of the heavily doped impurity regions 109. Here, the first interlayer insulating film 113 and the liner insulating film 112 may be dry-etched or wet-etched.

Figure 12:
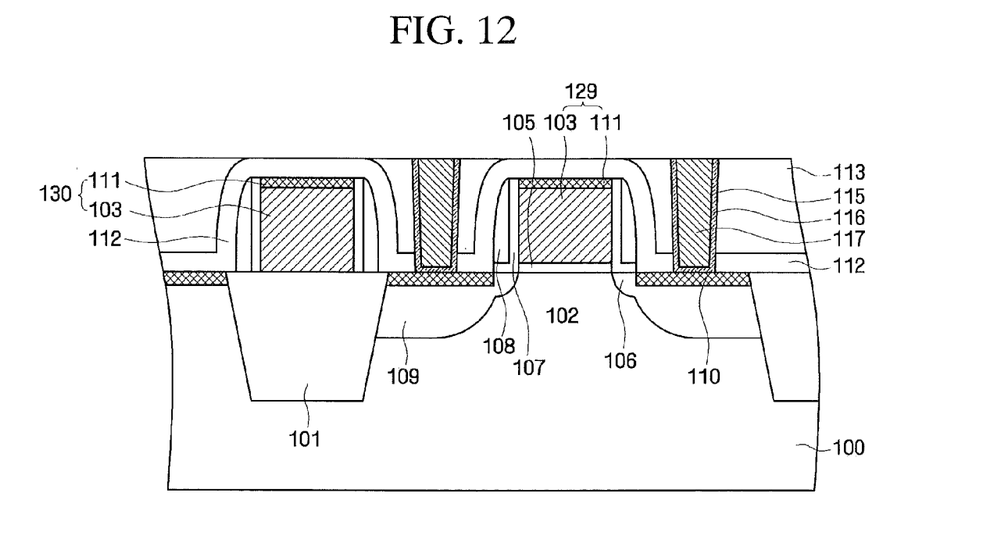

Next, referring to FIG. 12, the first photoresist pattern 114 is removed, and a first barrier metal film 116 is conformally formed on inner walls of the first contact hole 115. The first barrier metal film 116 may be a single film made of Ti, TiN, Ta or TaN, or may be a double film made of two of the above materials. The first barrier metal film 116 may be formed by CVD, ALD, sputtering, or electron beam deposition.

Next, a first sub contact plug 117 is formed by filling the first contact hole 115 with a conductive material and planarizing the conductive material.

Since the first contact hole 115 is formed in the liner insulating film 112 and the first interlayer insulating film 113 which are planarized to the height of the first and second gate electrodes 129 and 130, a sufficient contact area can be secured between the first sub contact plug 117 and the silicide film 110, and open defects which may occur in the process of filling the first contact hole 115 with the conductive material can be prevented.

Figure 13:
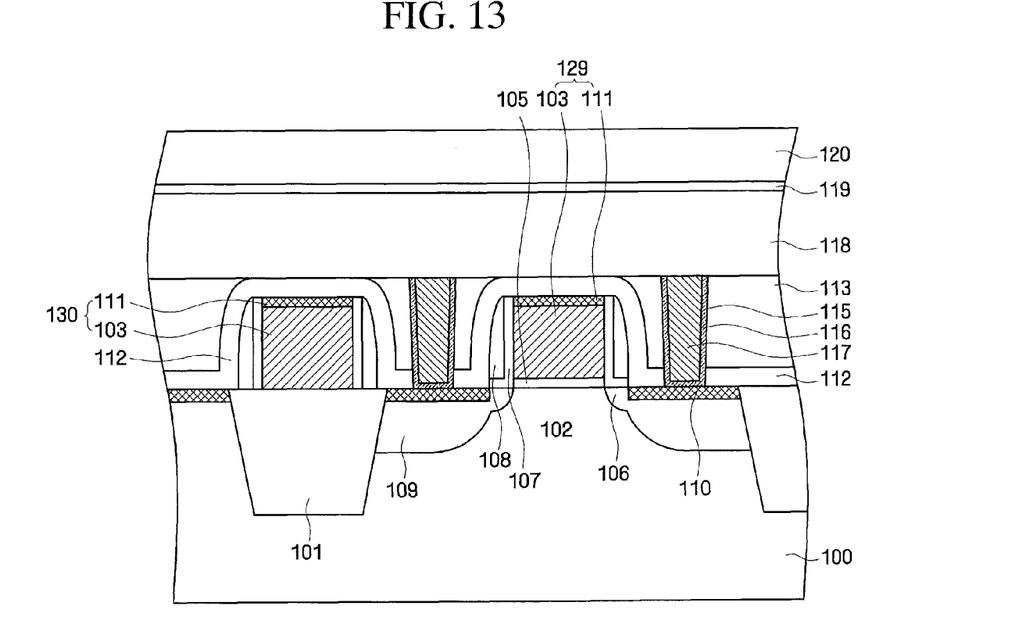

Next, referring to FIG. 13, a second interlayer insulating film 118, an etch-stop film 119, and a metal interlayer insulating film 120 are sequentially formed on the entire surface of the substrate 100 having the first sub contact plug 117.

Figure 14:
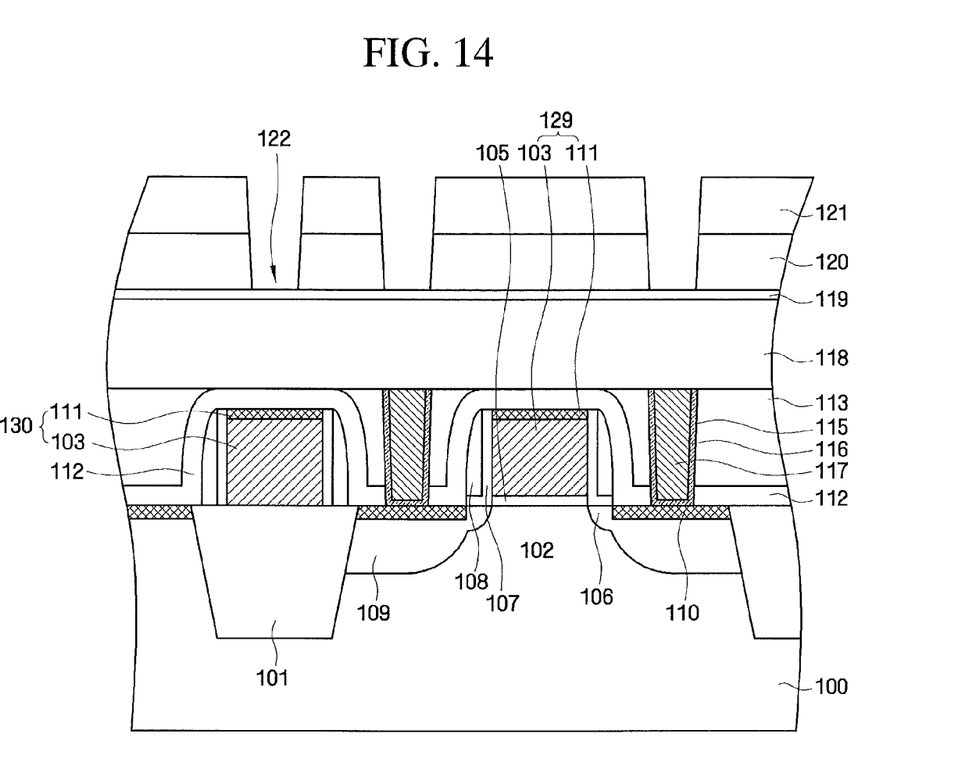

Then, referring to FIG. 14, a second photoresist pattern 121 which exposes regions corresponding respectively to the first sub contact plug 117 and the second gate electrode 130 is formed on the metal interlayer insulating film 120. Thereafter, the metal interlayer insulating film 120 is etched to the etch-stop film 119 using the second photoresist pattern 121 as an etch mask, thereby forming trenches 122 in the metal interlayer insulating film 120.

Figure 15:
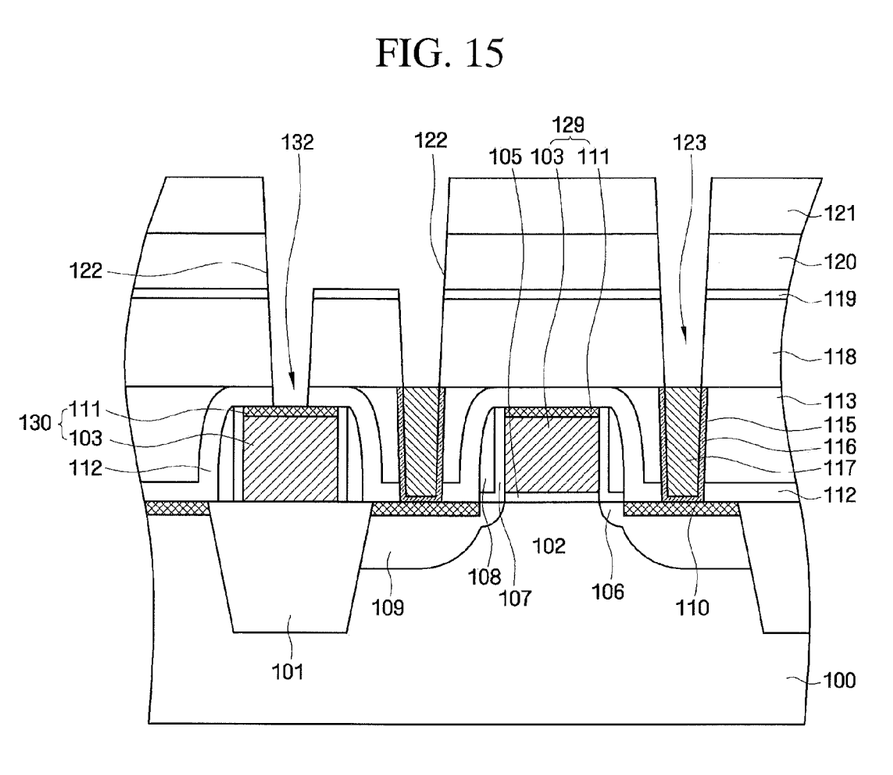

Next, referring to FIG. 15, the etch-stop film 119 and the second interlayer insulating film 118 are etched using the second photoresist pattern 121 as an etch mask, thereby forming a second contact hole 123 which exposes a predetermined region of the first sub contact plug 117 and forming a fourth contact hole 132 which exposes a predetermined region of the second gate electrode 130. The fourth contact hole 132 extends up to the liner insulating film 112 formed on the second gate electrode 130.

Next, a portion of the metal interlayer insulating film 120 formed between regions, which correspond respectively to the second gate electrode 130 and the first sub contact plug 117 neighboring the second gate electrode 130, may be removed.

Then, referring to FIG. 2, the second photoresist pattern 121 is removed, and a second barrier metal film 125 is conformally formed on inner walls of the trenches 122, the second contact hole 123, and the fourth contact hole 132.

Next, a conductive material is filled into the trenches 122, the second contact hole 123, and the fourth contact hole 132, thereby forming a second sub contact plug 126 and the second contact plug 127 in the second interlayer insulating film 118 and forming a metal wiring layer 128 in the metal interlayer insulating film 120. The conductive material that fills the second contact hole 123, the fourth contact hole 132, and the trenches 122 may have a lower resistance than the conductive material that fills the first contact hole 115. For example, the conductive material that fills the second contact hole 123, the fourth contact hole 132, and the trenches 122 may be copper. The second sub contact plug 126, the second contact plug 127, and the metal wiring layer 128 may formed by filling the trenches 122 and the second and fourth contact holes 123 and 132 with copper using MOCVD or electrical plating and by processing the surface of the metal wiring layer 128 to be at the same height as the surface of the metal interlayer insulating film 120 in a planarization process such as chemical mechanical polishing.

Unlike the first sub contact plug 117, if the second contact plug 127 which is connected to the second gate electrode 130 is made of copper having a low resistance, the resistance of the second contact plug 127 can be reduced. In addition, if the second sub contact plug 126 which is part of the first contact plug 131 is made of copper having a low resistance, the resistance of the first contact plug 131 can be reduced.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:
1. A semiconductor device comprising:
a substrate having an impurity region therein;
a gate electrode on the substrate;
first and second interlayer insulating films on the substrate, said first interlayer insulating film extending between the second interlayer insulating film and the substrate;
a metal interlayer insulating film on the second interlayer insulating film, said metal interlayer insulating film comprising a plurality of metal wiring layers therein;
a liner insulating film extending between the second interlayer insulating film and the gate electrode;
a first contact plug electrically connecting a first of the plurality of metal wiring layers to the impurity region; and
a second contact plug electrically connecting a second of the plurality of metal wiring layers to the gate electrode, said second contact plug extending through said liner insulating film;
wherein the first contact plug is formed in the first and second interlayer insulating films, and the second contact plug is formed in the second interlayer insulating film and the liner insulating film, and
wherein said liner insulating film directly contacts a vertical sidewall of said second contact plug.
2. The semiconductor device of claim 1, wherein the second interlayer insulating film comprises a low-k dielectric material.

3. The semiconductor device of claim 2, wherein the low-k dielectric material comprises one of silicon oxycarbide (SiOC), carbon-doped hydrogenated silicon oxide (SiOCH), fluoro-silses-quioxane (FSQ), hydro-silses-quioxane (HSQ), and methyl-silses-quioxane (MSQ).

4. The semiconductor device of claim 1, wherein a top surface of the liner insulating film disposed on the gate electrode is at the same height as a top surface of the first interlayer insulating film.

5. The semiconductor device of claim 1, wherein the liner insulating film comprises silicon nitride (SiNx).

6. The semiconductor device of claim 1, wherein the first contact plug comprises a first sub contact plug which is formed in the first interlayer insulating film and a second sub contact plug which is formed in the second interlayer insulating film.

7. The semiconductor device of claim 6, wherein the first sub contact plug and the second sub contact plug are made of different conductive materials.

8. The semiconductor device of claim 7, wherein the conductive material that forms the first sub contact plug comprises tungsten, and the conductive material that forms the second sub contact plug comprises copper.

9. The semiconductor device of claim 8, wherein a conductive material that forms the second contact plug comprises copper.

10. The semiconductor device of claim 6, wherein the first sub contact plug further comprises a first barrier metal film conformally formed along inner walls of a first contact hole which is formed in the first interlayer insulating film, and the second sub contact plug further comprises a second barrier metal film conformally formed along inner walls of a second contact hole which is formed in the second interlayer insulating film.

11. The device of claim 1, wherein said liner insulating film contacts the substrate.

12. The device of claim 1, further comprising a silicide film directly on the gate electrode, wherein said second contact plug contacts the silicide film.

13. The device of claim 1, further comprising a device isolation region in the substrate, wherein the gate electrode directly contacts the device isolation region.

14. An integrated circuit device, comprising:
a semiconductor substrate having an impurity region therein;
an electrode on the substrate;
a first interlayer insulating layer on said semiconductor substrate;
a second interlayer insulating layer on said first interlayer insulating layer;
a liner insulating layer extending between the second interlayer insulating layer and said electrode and between the first interlayer insulating layer and the impurity region;
a metal interlayer insulating layer on the second interlayer insulating layer, said metal interlayer insulating layer having a plurality of metal wiring layers therein;
a first contact plug electrically connecting a first of the plurality of metal wiring layers to the impurity region, said first contact plug extending through the first interlayer insulating layer and said liner insulating layer; and
a second contact plug electrically connecting a second of the plurality of metal wiring layers to said electrode, said second contact plug extending through the second interlayer insulating layer and said liner insulating layer, wherein a portion of said second contact plug is formed in said liner insulating layer and said liner insulating layer directly contacts a vertical sidewall of said second contact plug.

15. The device of claim 14, further comprising a device isolation region in said semiconductor substrate; and wherein the electrode extends opposite the device isolation region.

16. The device of claim 14, wherein a top surface of said liner insulating layer and a top surface of said first interlayer insulating layer are coplanar.

17. The device of claim 14, wherein said liner insulating layer and said first interlayer insulating layer comprise different materials.

18. The device of claim 17, wherein said liner insulating layer comprises silicon nitride.

19. The device of claim 14, further comprising a silicide film directly on the electrode, wherein said second contact plug contacts the silicide film.

20. The device of claim 15, wherein the electrode directly contacts the device isolation region.

* * * * *